United States Patent [19]

Neugebauer et al.

[11] Patent Number: 5,100,740
[45] Date of Patent: Mar. 31, 1992

[54] DIRECT BONDED SYMMETRIC-METALLIC-LAMINATE/SUBSTRATE STRUCTURES

[75] Inventors: Constantine A. Neugebauer; James F. Burgess, both of Schenectady; Homer H. Glascock, II, Scotia, all of N.Y.

[73] Assignee: General Electric Company, Schenectady, N.Y.

[21] Appl. No.: 777,495

[22] Filed: Oct. 15, 1991

Related U.S. Application Data

[63] Continuation of Ser. No. 412,052, Sep. 25, 1989, abandoned.

[51] Int. Cl.⁵ .................. B32B 15/04; C04B 37/02; B23K 35/22
[52] U.S. Cl. .................. 428/622; 428/621; 428/632; 428/629; 428/663; 428/665; 428/674; 228/121; 228/124
[58] Field of Search .......... 428/621, 627, 632, 633, 428/663, 664, 665, 674, 620, 629; 228/122, 123, 124, 121, 263.18, 263.12

[56] References Cited

U.S. PATENT DOCUMENTS

| | | | |
|---|---|---|---|
| 2,387,903 | 10/1945 | Hensel | 428/665 |
| 3,000,085 | 9/1961 | Green | 428/665 |
| 3,454,374 | 7/1969 | Domin | 428/663 |
| 3,744,120 | 7/1973 | Burgess | 228/196 |
| 3,766,634 | 10/1973 | Babcock | 228/188 |
| 3,911,553 | 10/1975 | Burgess | 228/195 |
| 3,994,430 | 11/1976 | Cosano et al. | 357/79 |
| 4,025,997 | 5/1977 | Gernitig et al. | 428/663 |
| 4,129,243 | 12/1978 | Cosano et al. | 357/79 |
| 4,505,418 | 3/1985 | Neidig et al. | 228/124 |
| 4,521,801 | 6/1985 | Kato et al. | 357/71 |
| 4,563,383 | 1/1986 | Kunenman et al. | 428/216 |
| 4,598,025 | 7/1986 | Mizuhara | 228/122 |
| 4,693,409 | 9/1987 | Mizunoya et al. | 228/263.18 |
| 4,699,310 | 10/1987 | Kohno et al. | 228/124 |
| 4,835,065 | 5/1989 | Sato et al. | 428/665 |
| 4,860,939 | 8/1989 | Guinet et al. | 228/124 |

FOREIGN PATENT DOCUMENTS

| | | | |
|---|---|---|---|
| 59-121890 | 7/1984 | Japan | 228/123 |
| 60-4050 | 1/1985 | Japan | 428/664 |
| 2059323 | 4/1981 | United Kingdom | |

OTHER PUBLICATIONS

Patent Office of Japan, File Supplier Japs & JP-A-20 36 553 (Sumitomo Electric Ind. Ltd) 06-02-1990 Abstract.

*Primary Examiner*—John Zimmerman
*Attorney, Agent, or Firm*—Marvin Snyder; James C. Davis, Jr.

[57] ABSTRACT

A composite structure comprising a symmetric bimetallic laminate bonded to a separate substrate is provided by eutectic bonding the bimetallic laminate to the substrate. A variety of beneficial structures can be provided.

25 Claims, 11 Drawing Sheets

DIRECT BONDED SYMMETRIC-METALLIC-LAMINATE/SUBSTRATE STRUCTURES

This invention was made with Government support under contract N61533-89-C-0004 awarded by DARPA. The Government has certain rights in this invention.

This application is a continuation of application Ser. No. 07/412,052, filed Sept. 25, 1989, now abondoned.

BACKGROUND OF THE INVENTION

1. Field of the Invention

The present invention relates to the field of direct bonded metallic/substrate structures, and more particularly, to thermally matched structures of this type.

2. Background Information

In semiconductor device packaging and other arts, there is often a need to form a bond between a metallic and a ceramic structure or between two metallic structures which provides a hermetic seal and which will withstand high processing and operating temperatures. The direct bond copper process which is described in U.S. Pat. Nos. 3,744,120, 3,854,892 and 3,911,553 to Burgess et al.; U.S. Pat. Nos. 3,766,634 and 3,993,411 to Babcock et al.; U.S. Pat. Nos. 3,994,430 and 4,129,243 to Cusano et al.; U.S. Pat. No. 4,409,278 to Jochym; and U.S. Pat. No. 4,563,383 to Kuneman et al. met this need by forming a copper oxygen eutectic mixture which wets both metallic copper and ceramic materials such as alumina and beryllia and which bonded the members together upon solidification. This process has been in use for many years. Each of these patents is incorporated herein by reference.

The basic ones of these patents (3,766,634; 3,993,411; 3,744,120 and 3,854,892) each state that "One factor which appears to affect the tenacity and uniformity of the bond is the relationship between the melting point of the metallic member and the eutectic temperature. Where the eutectic temperature is within approximately 30° to 50° C., of the melting point of the metallic member, for example, the metallic member tends to plastically conform to the shape of the substrate member and thereby produce better bonds than those eutectics which become liquids at temperatures greater than approximately 50° C. below the melting point of the metallic member. The uniformity of the bond, therefore, appears to be related to the 'creep' of the metal which becomes considerable only near the melting point. From Table I [not reproduced here], for example, it can be seen that the following eutectic compounds meet this requirement: copper-copper oxide, nickel-nickel oxide, cobalt-cobalt oxide, iron-iron oxide and copper-copper sulfide." Thus, it is considered important in this field that the metallic member be near its melting point during the bonding process in order that the metallic member may be conformed to the surface of the substrate by the tension of the liquid eutectic mixture.

As a need for larger and larger substrates and packages has developed, the use of direct bonded copper in combination with ceramic substrates has created a thermal mismatch problem in that copper has a relative thermal coefficient of expansion of about 16, while alumina has a relative thermal coefficient of expansion of about 7, and beryllia has a relative thermal coefficient of expansion of about 8. Since the eutectic bonds in a copper/copper oxide eutectic structure are formed at 1,065° C., substantial stress and warping is induced in large structures during the cooling process. A number of techniques have been employed in an attempt to overcome this problem. In one of these techniques, rather than a continuous copper layer, a matrix of smaller copper units has been bonded to the ceramic to avoid a large expanse of copper bonded to the ceramic which tends to form a "bimetallic" strip. As another alternative, a large area copper foil was formed with hoops between flat sections with only the flat sections being direct bonded to the ceramic with the hoops providing strain relief. Both of these techniques have the drawbacks that they result in a more complicated structure than a single continuously bonded copper layer would provide (if not for the thermal mismatch problem), a more complex fabrication procedure is involved and in the latter case, a non-planar surface results. There is a need for a direct bond metallic ceramic structure which is substantially free of thermal mismatch.

U.S. Pat. 4,563,383 to Kuneman et al. which is cited above, discloses a method of fabricating a ceramic/metallic laminate structure which is free of thermal coefficient of expansion mismatch-induced bending. Two substantially identical ceramic substrates each have a thin copper foil eutectic bonded to one surface thereof. Thereafter, these two substrates are placed on opposite sides of a central copper foil with their copper-coated sides toward the foil and a eutectic bond is formed between the central foil and each of the foils already bonded to the ceramic. Alternatively, all three eutectic bonds may be formed in a single heating step. The resulting structure is symmetric and, therefore, free of thermal coefficient of expansion mismatch induced bending. While the resulting ceramic substrate is beneficial for appropriate applications, it does not solve the problem of thermal coefficient of expansion mismatch-induced bending in ceramic/metallic structures which by their nature, must be or are asymmetric.

A symmetric bimetallic laminate of copper-molybdenum-copper (Cu-Mo-Cu) has been developed to provide metallic members having thermal coefficients of expansion which are between the thermal coefficients of expansion of copper and molybdenum and which are free of thermal coefficient of expansion mismatch-induced bending. The symmetric bimetallic foils differ from typical bimetallic strips which are intended to bend in response to changes in temperature, in that a central core of molybdenum is provided with two identical layers of copper each laminated to a different side of the core so that a symmetric sandwich structure results in which the copper is the bread of the sandwich and the molybdenum is the filling of the sandwich. Since the bread layers have the same composition and the same thickness, the stresses induced by thermal coefficient of expansion mismatch are equal on both sides of the core layer and no bending is induced. This symmetric bimetallic laminate finds application in those situations where a thermal coefficient of expansion intermediate that of the bread and sandwich layers is desired. Other such laminates such as copper-tungsten-copper would also be useful. The Cu-Mo-Cu laminate is formed by rolling and is readily available. We have been unsuccessful in finding roller laminated Cu-W-Cu. Cu-W-Cu has been reported to be available in which the tungsten is a matrix or grid and the copper layers cover both side of the tungsten and merge in the holes in the matrix or grid in what is known as an infiltrated copper structure.

There is a need for a method of fabricating metallic/ceramic composites which are asymmetric and substantially free of thermal coefficient of expansion mismatch-induced bending.

OBJECTS OF THE INVENTION

Accordingly, a primary object of the present invention is to provide a method of forming an asymmetric metallic/ceramic structure which is free of thermal coefficient of expansion mismatch-induced bending.

Another object of the present invention is to provide a metallic/ceramic composite structure in which the metallic and ceramic portions have matched coefficients of thermal expansion.

Another object of the present invention is to provide a composite symmetric metallic laminate/ceramic structure.

SUMMARY OF THE INVENTION

The above and other objects which will become apparent from this specification as a whole, including the drawings, are achieved in accordance with one embodiment of the invention by eutectic bonding a symmetric bimetallic laminate to a substrate which may be a metal or a ceramic. Where the substrate is ceramic, the ceramic preferably has a foil of the bread metal of the symmetric bimetallic laminate eutectic bonded to the ceramic and that foil is in turn eutectic bonded to the symmetric bimetallic laminate.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION

Figure 1:
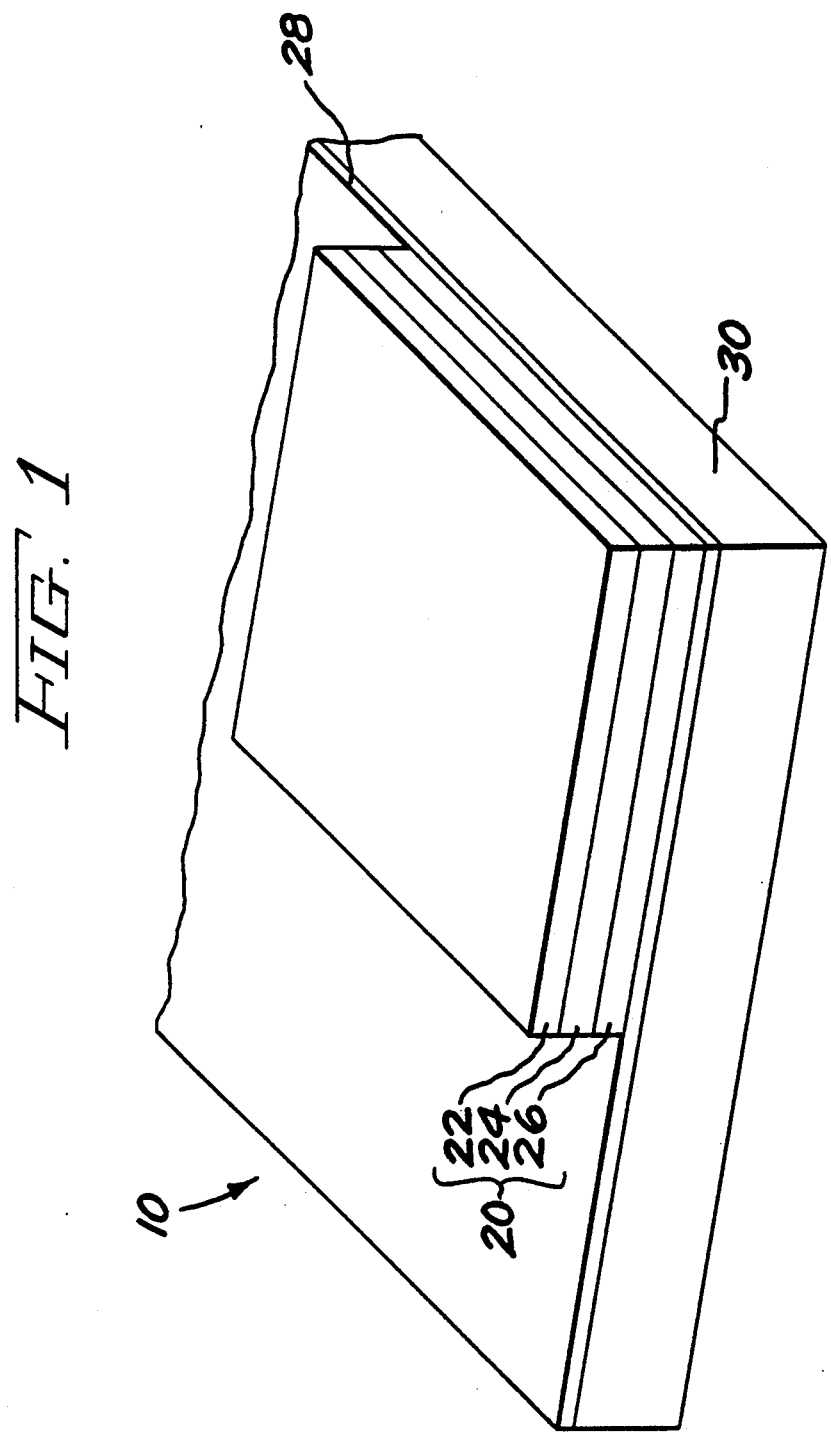
FIG. 1 illustrates a symmetric bimetallic laminate direct bonded to a copper substrate.

In FIG. 1, a composite structure 10 is illustrated in which a metallic substrate 30 has a symmetric bimetallic laminate 20 bonded to the upper surface thereof by a eutectic bond 28. A primary application of this structure is with a bimetallic laminate 20 having copper as its two outer layers 22 and 26 and a lower thermal coefficient of expansion metal, such as molybdenum or tungsten as the inner layer 24. This inner layer or core metal, such as molybdenum or tungsten, is known to scavenge oxygen.

Figure 2:
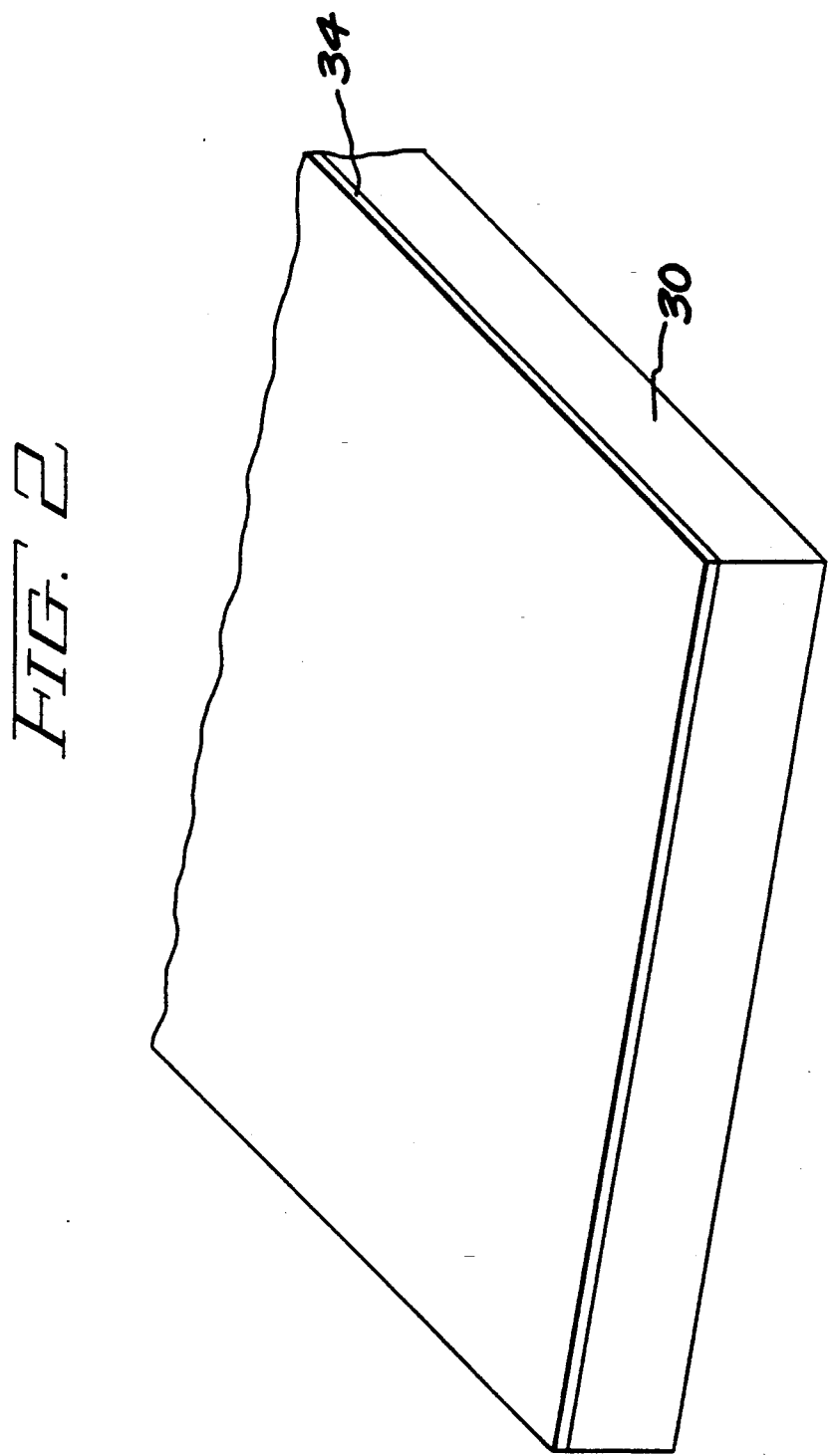
FIGS. 2-4 illustrate a process for producing the FIG. 1 structure.
Figure 3:
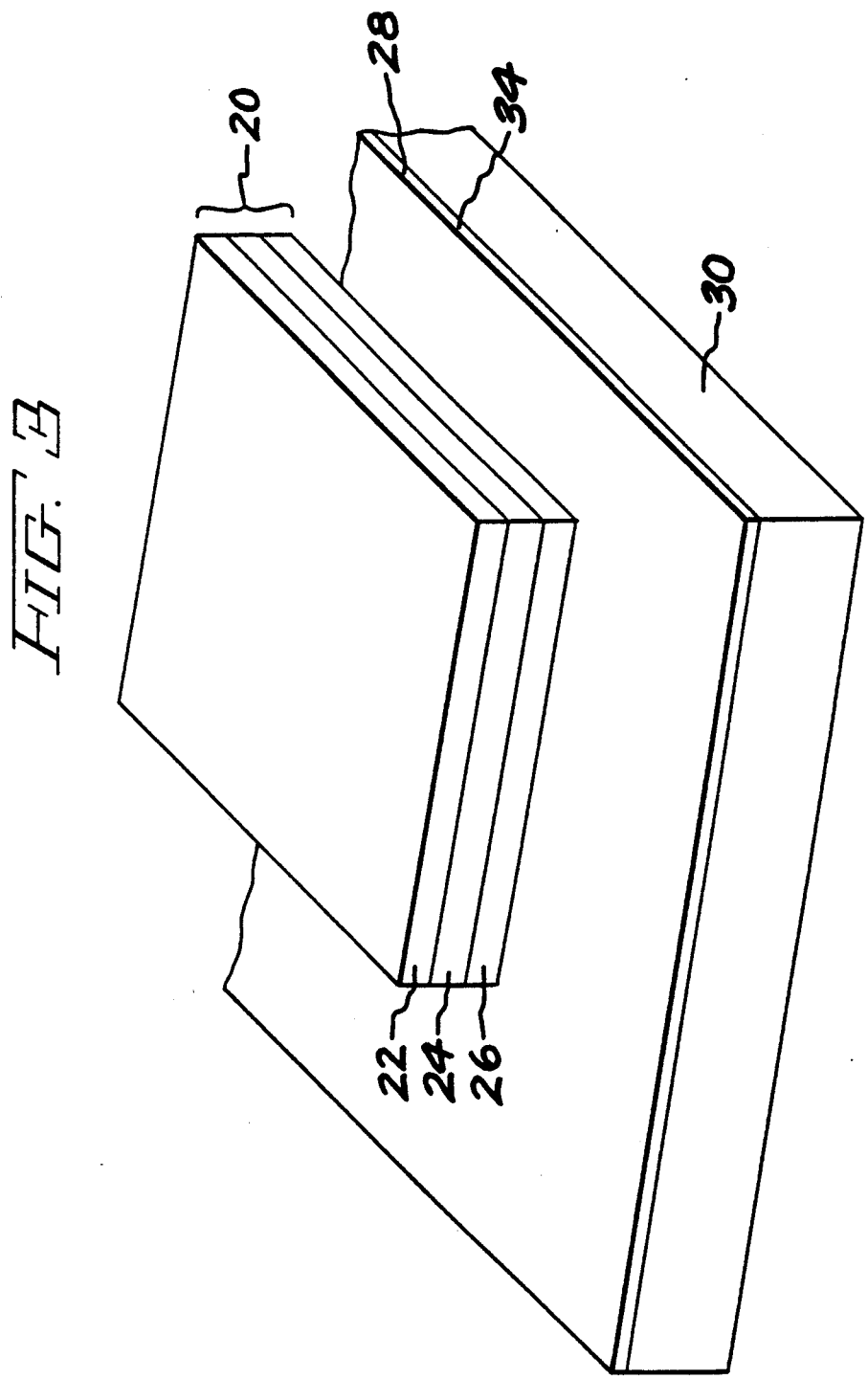

The composite 10 of FIG. 1 may be formed in the following manner. First, the copper substrate 30 is oxidized on the upper surface thereof to form a thin oxide layer 34 as shown in FIG. 2. The symmetric bimetallic laminate 20 is then brought into a desired alignment with the substrate 30, as shown in FIG. 3, and placed in contact with the copper oxide layer 34.

The entire composite structure is then run through a direct bonding temperature profile for the copper-copper oxide eutectic bond which it is desired to form between the copper substrate 30 and the symmetric bimetallic laminate 20. In the case of copper, this involves heating the structure to a temperature of at least 1,065° C., but less 1,083° C. (the melting point of copper). In this temperature range, the copper-copper oxide mixture is liquid, but the copper metal is not. This heating step is done in a controlled atmosphere containing some oxygen, as taught in the above-identified patents in order to maintain sufficient oxygen in the copper-copper oxide eutectic to form the bond, while at the same time, ensuring that the eutectic mixture does not convert entirely to copper oxide which would not form the bond. The composite structure is maintained at the eutectic forming temperature for a period of from a few seconds to many minutes and then cooled to less than 1,065° C. to solidify the eutectic mixture and thereby form a secure bond between the symmetric bimetallic laminate 20 and the copper substrate 30. This is known as a direct bond because the bond is formed directly between the two members by a eutectic mixture rather than by intermediary materials such as solder or adhesives.

We have found that this process forms sound eutectic hermetic bonds which are free of voids despite the high melting point (2,610° C.) of the central layer of the symmetric bimetallic Cu-Mo-Cu laminate which is well in excess of 50° C. higher than the eutectic formation temperature. Despite the close approach of the structure to the melting point (1,083° C.) of the copper outer layers, the symmetric bimetallic laminate is apparently unaffected by these temperatures and does not debond. These unexpected results provide great advantages in the electronic arts since it is now possible to form ceramic/symmetric bimetallic laminate structures in which each component has substantially the same thermal coefficient of expansion, thereby substantially eliminating thermal stress and thermal coefficient of expansion mismatched-induced bending. Such composite structures are suitable for use in much larger sizes than are feasible with prior art copper/ceramic composite structures. This also provides the advantages of enabling large ceramic structures to be provided with symmetric bimetallic laminate heat conductors without inducing thermal coefficient of expansion mismatch induced stresses into the structure. The presence of such stresses in electronic packages gives rise to significant long term reliability concerns since the accumulated effect of multiple thermal cycles in the presence of such stresses can be deterioration of hermetic seals which eventually leads to leakage or to separation of bonds, both of which increase the risk of system deterioration and malfunction. It also provides the advantage that other objects having thermal coefficients of expansion which do not match the ceramic can be bonded to the exposed copper layer of the bimetallic laminate as a means of bonding them to the ceramic with reduced thermal coefficient of expansion mismatch-induced stresses. In the past, such objects have been bonded to a substrate with a copper layer between the objects and the ceramic, but that induces one stress in the process of compensating for another. Use of our symmetric bimetallic laminate/ceramic composite for this purpose avoids introducing the copper/ceramic thermal coefficient of expansion mismatch while retaining the bondability and stress relief benefits of the copper layer.

Thus, the structure illustrated is advantageous for mounting ceramic and other relatively low thermal coefficient of expansion bodies to the copper substrate 30, since the symmetric bimetallic laminate may be selected to have a thermal coefficient of expansion which is substantially the same as that of the ceramic by proper selection of the composition of and the relative thicknesses of the three layers 22, 24 and 26 of that symmetric bimetallic laminate.

While the fabricated structure employed a Cu-Mo-Cu symmetric bimetallic laminate, this process is of general applicability to the bonding of symmetric bimetallic laminates because it establishes that the presence of a high melting point core layer does not prevent the formation of a direct bond between the outer layer and ceramics or other materials, as discussed below. Thus, this will be useful with tungsten cored symmetric bimetallic laminates when they become available. For the same reasons, this process is also applicable to infiltrated copper structures in which the core layer has apertures therein which are filled with copper.

Figure 4:
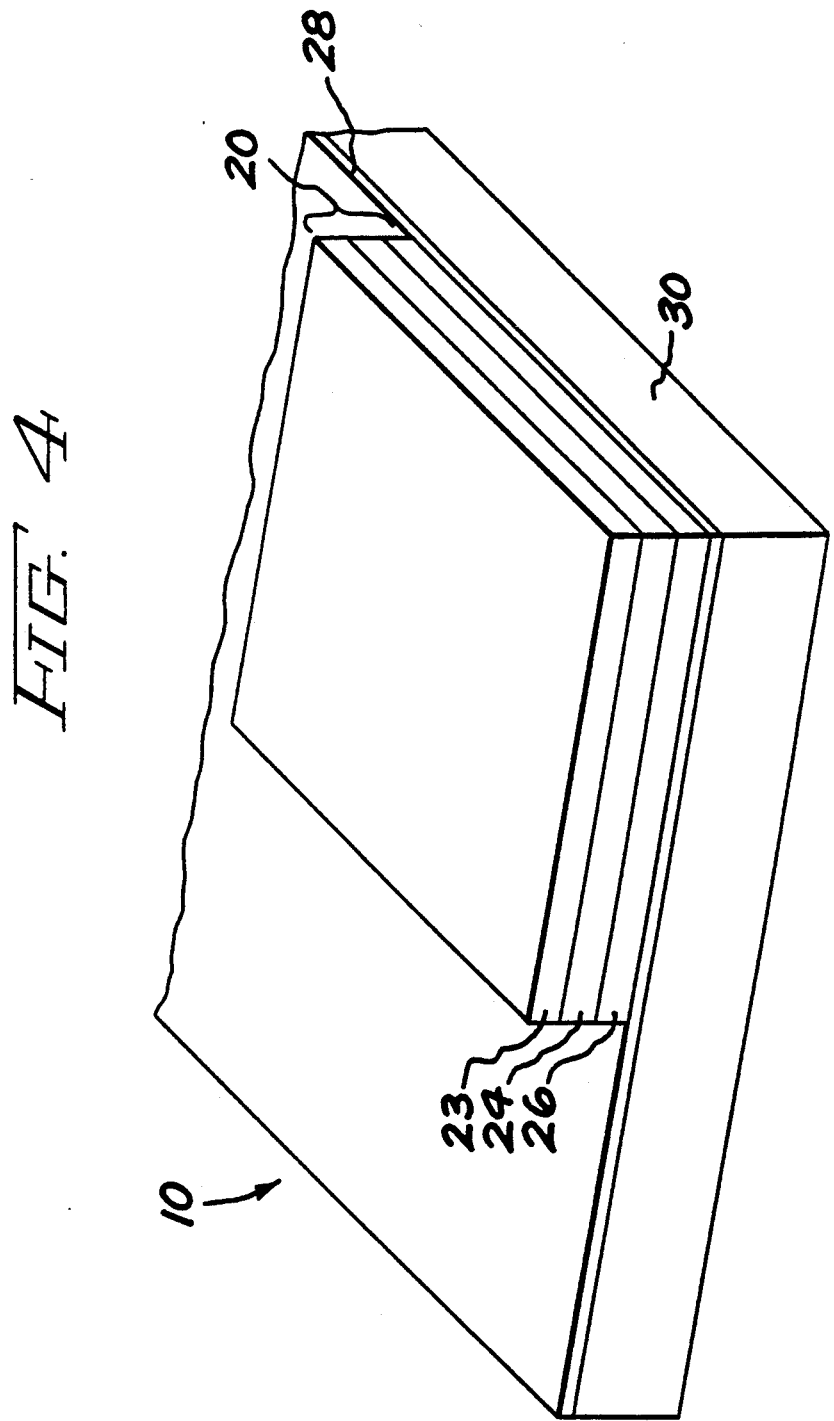

While the structure illustrated in FIG. 1 is fabricated in accordance with the preferred sequence described in connection with FIGS. 2-4, it should be recognized, that for practical purposes, the foil layer 28 may be viewed as being a portion of the lower layer 26 of the symmetric bimetallic laminate since the eutectic layer 28 comprises primarily copper with only a small percentage of oxygen present.

Consequently, for large area bonds (or thick foil) formed in this fashion, the initial symmetric bimetallic laminate 20 may have a lower layer 26 which is thinner than its upper layer 22 by the thickness of the foil layer 28 so that, upon completion of the bonding process, a truly symmetric bimetallic laminate is present in the structure.

Figure 5:
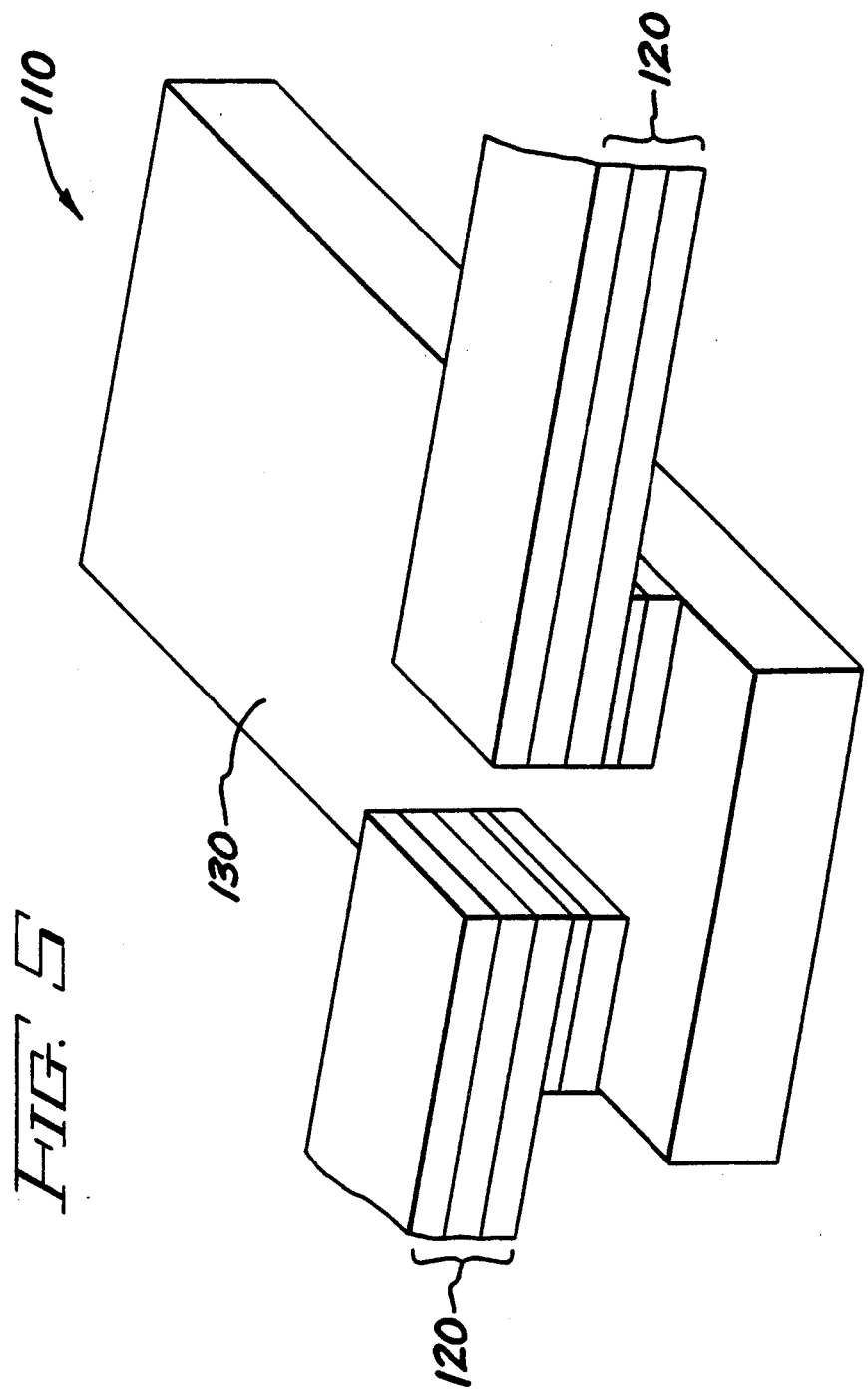
FIG. 5 illustrates symmetric bimetallic laminates direct bonded to a ceramic substrate.
Figure 6:
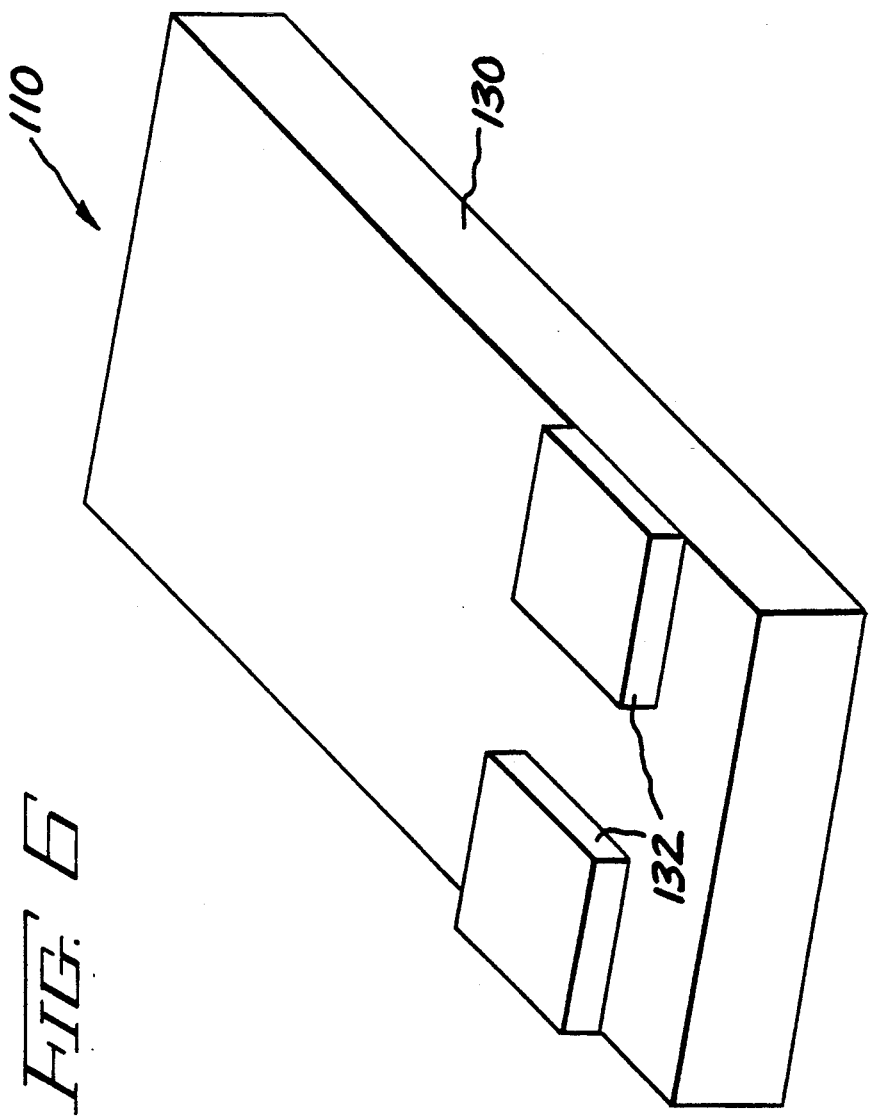
FIGS. 6-8 illustrate a process for producing the FIG. 5 structure.
Figure 7:
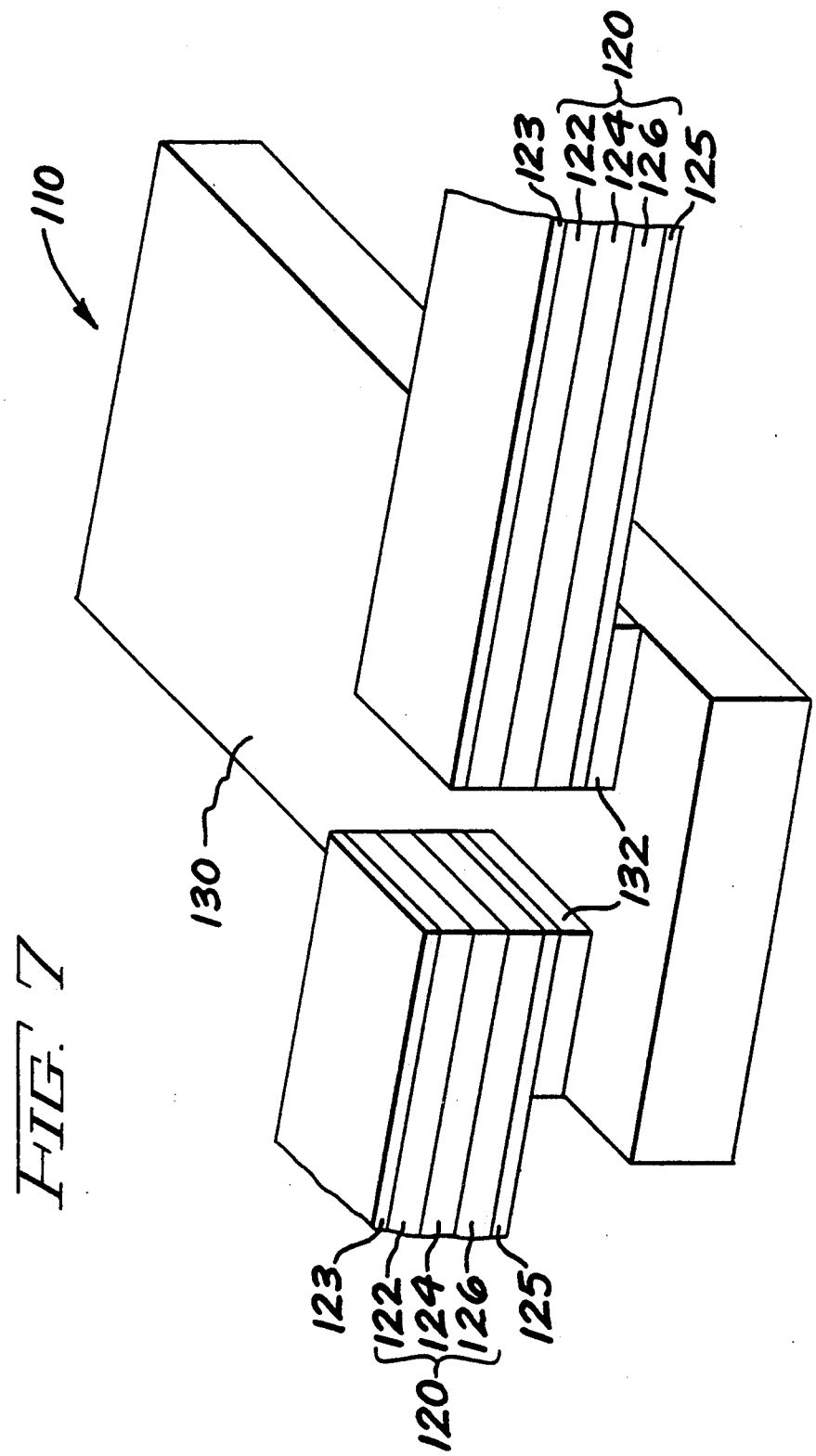
Figure 8:
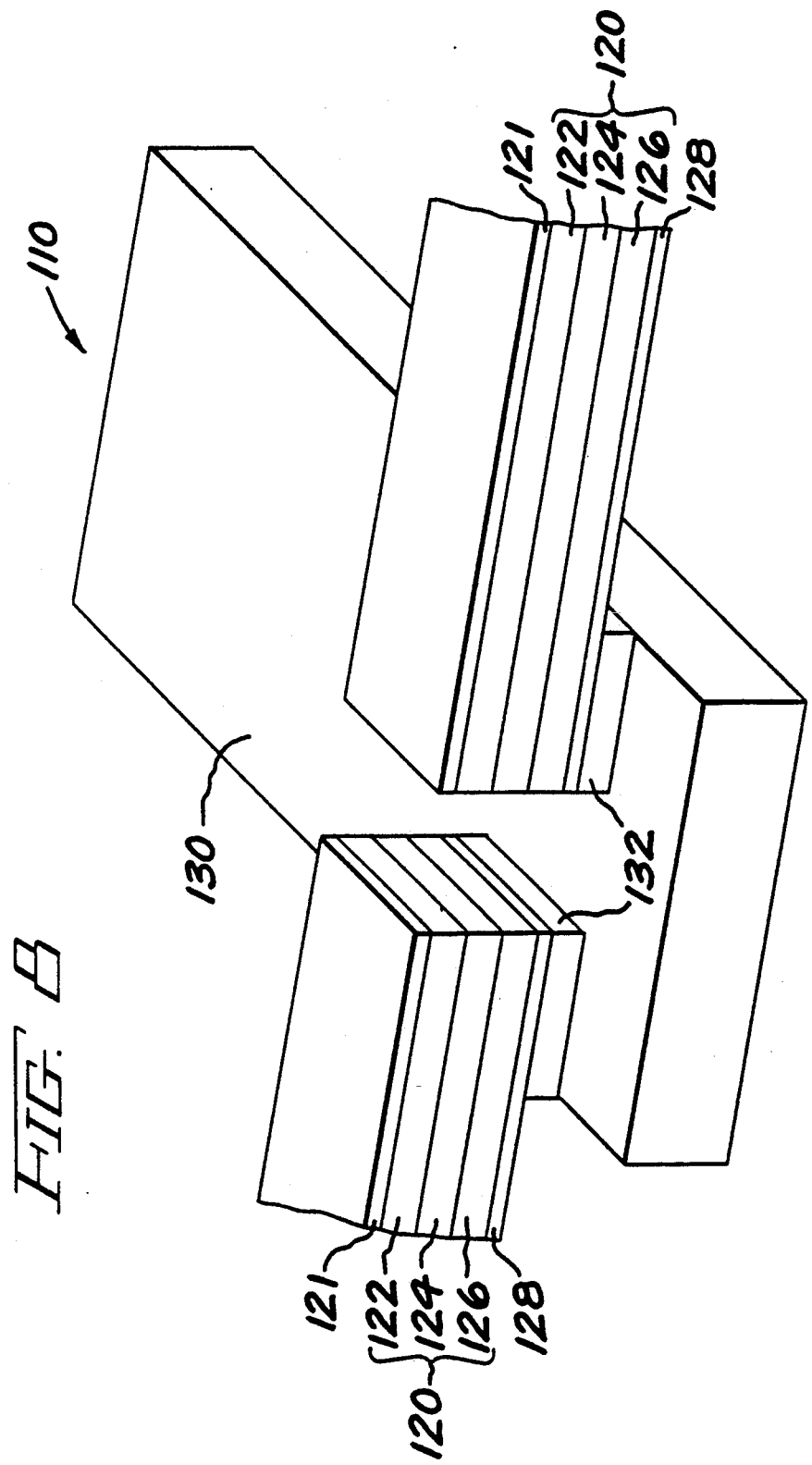

In FIG. 5, a ceramic/symmetric bimetallic laminate composite structure is illustrated generally at 110. The composite 110 comprises a ceramic substrate 130 with two separate symmetric bimetallic laminates 120 direct bonded to the upper surface thereof. This structure was formed in the following fashion with only one of the symmetric bimetallic laminate strips 120 present and without the cantilevered portion. A thin copper foil 132 was disposed on the upper surface of the alumina ceramic substrate 130 in the location in which it was desired to bond the symmetric bimetallic laminate. This foil was direct bonded to the ceramic by passing this composite structure through a direct bonding temperature profile for copper in a manner which is well known in the direct bond copper art. The composite structure was then cooled to provide the structure shown in FIG. 6. The exposed copper surface of the copper-molybdenum-copper laminate 120 was oxidized to form a thin oxide layer 125 (and 123). Next, the symmetric bimetallic laminate was placed on top of the foil 132 with the oxide layer 125 disposed toward the substrate, as shown in FIG. 7. The purpose of the oxide layer 125 is to provide the oxygen necessary for the formation of a copper-copper oxide eutectic bond between the lower outer copper foil 126 of the symmetric bimetallic laminate 120 and the copper foil 132 which is already direct bonded to the ceramic substrate 130. This composite structure was then passed through a eutectic bonding temperature profile for the copper-copper oxide eutectic which involved raising the composite temperature to between 1,065° C. and 1,083° C. Once the eutectic liquid had formed and wetted both the foil 132 and the foil 126, the composite structure was cooled to solidify the eutectic 128 to form a permanent bond between the foils 126 and 132 as shown in FIG. 8. The oxide layer 123 on the upper copper layer 122 and the eutectic 121 on the upper copper layer form as a consequence of the oxidation and eutectic bonding steps, respectively, but do not participate in the formation of this composite structure.

Figure 9:
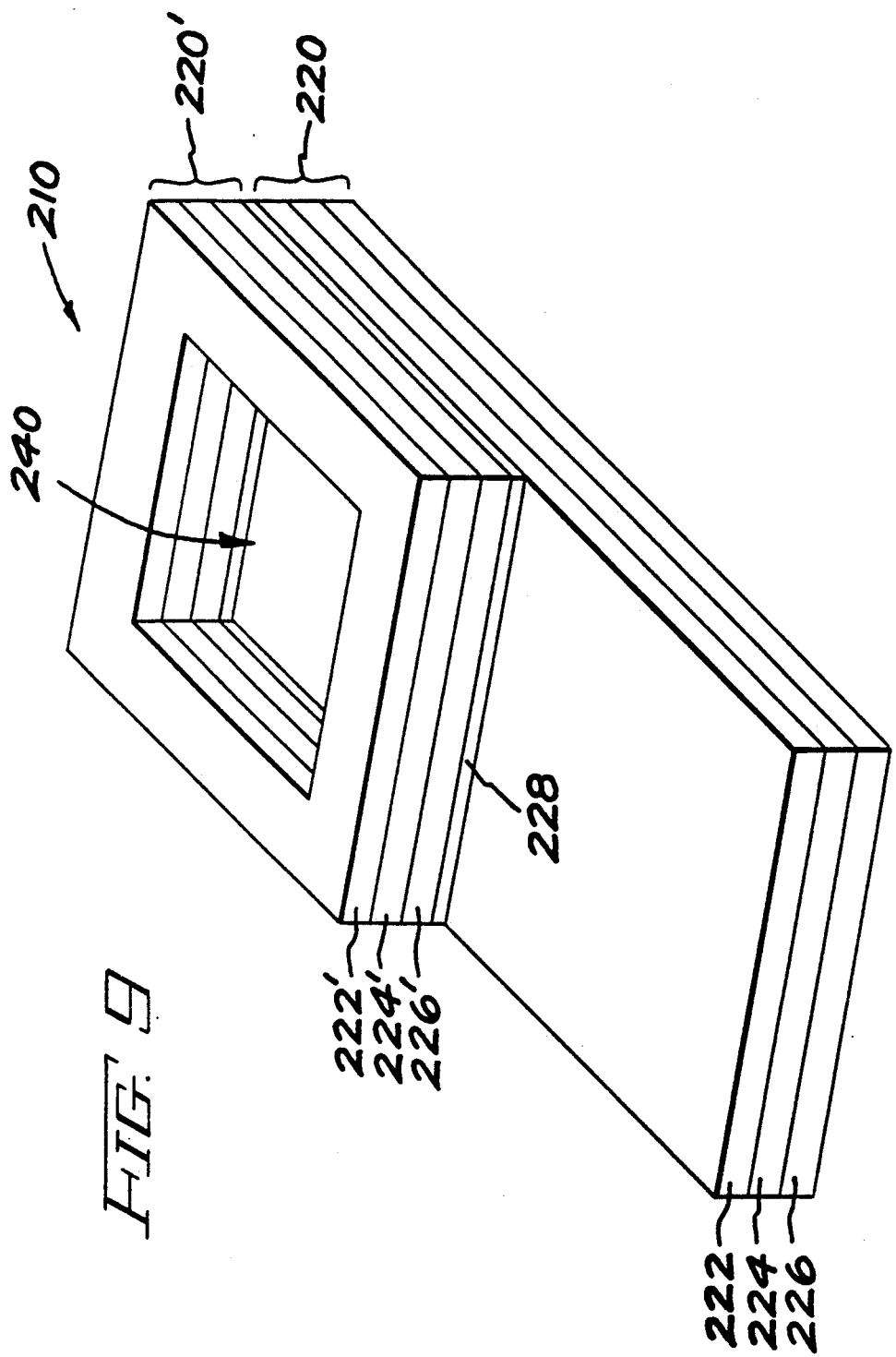
FIG. 9 illustrates a hermetic cavity fabricated in accordance with the present invention.

FIG. 9 illustrates a composite structure 210 comprising two separate symmetric bimetallic laminates 220 and 220' eutectic bonded to each other by eutectic layer 228. In the composite 210, the upper symmetric bimetallic laminate 220' has the configuration of an open rectangular annulus or "picture frame" to provide a cavity 240 in which a semiconductor chip or other component may be mounted and hermetically sealed by attachment of a cover to the top of the frame 220'.

The composite structure 210 is fabricated by providing the open frame symmetric bimetallic laminate 220' and the solid lower bimetallic laminate 220 and oxidizing either the upper surface of the lower bimetallic laminate 220 or the lower surface of the upper bimetallic laminate 220', placing the two layers in contact in their desired orientation and passing the composite structure through a direct bonding temperature profile for the eutectic material which forms the bonding layer 228.

Figure 10:
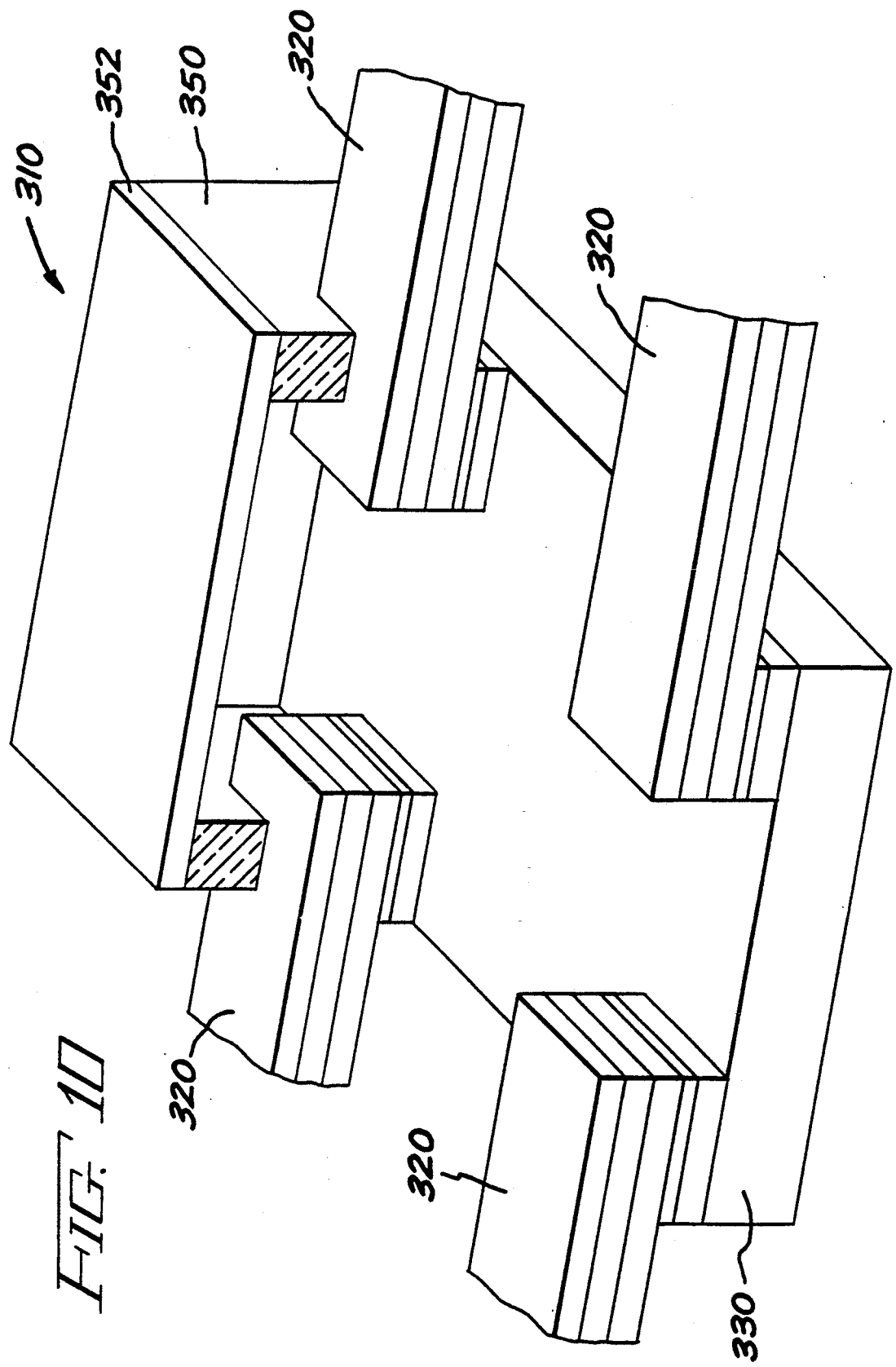
FIG. 10 illustrates a ceramic, glass, and symmetric bimetallic laminate composite in accordance with the present invention.

In FIG. 10, an alternative package configuration 310 is illustrated. In this package, a ceramic substrate 330 has a plurality of symmetric bimetallic members 320 direct bonded to its upper surface to serve as external leads for the package as well as feedthroughs through the hermetic seal of the package. A seal ring 350 of glass, which is only shown toward the back of the figure, seals a cover or lid 352 over the package cavity to hermetically seal the interior of the cavity. The glass 350 is selected with a composition whose thermal coefficient of expansion matches that of the ceramic substrate 330 as are the composition and relative thicknesses of the three layers of the symmetric bimetallic laminates 320. The cover 352 is also preferably a symmetric bimetallic laminate having the same coefficient of expansion as the glass 350. A substantial advantage of this package is the fact that all of its components have essentially the same thermal coefficient of expansion and the fact that none of its components is magnetic. This is particularly advantageous for the packaging of high frequency electronic devices in which the presence of magnetic materials would undesirably augment inductances within the system. The lid 352 is preferably sealed to the glass frame 350 by use of solder glass to form a bond between the symmetric bimetallic laminate 352 and the upper surface of the glass seal ring 350.

Figure 11:
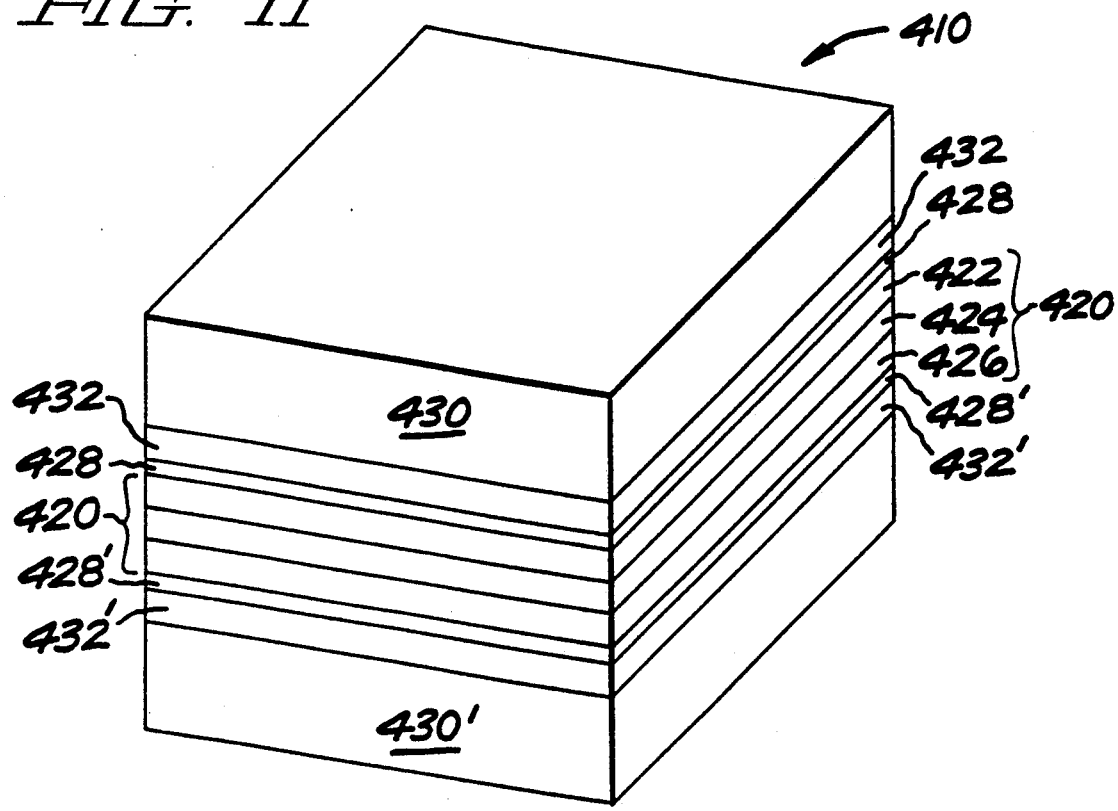
FIG. 11 illustrates a ceramic/symmetric bimetallic laminate structure in accordance with the present invention which is itself symmetric.

In FIG. 11, a symmetric ceramic/bimetallic laminate 410 is illustrated in perspective view. This symmetric laminate comprises two ceramic substrates 430 and 430' which are bonded to opposite sides of a symmetric bimetallic laminate 420 by eutectic bonds. This composite may preferably be formed by first direct bonding a copper foil 432 to what will be the underside of the upper substrate 430 and direct bonding a similar foil 432' to what will be the upper surface of the lower substrate 430'. A thin oxide layer is then formed on the exposed surface of each of the foils 432 and 432'. The symmetric bimetallic laminate 420 is then stacked with the two substrates 430 and 430' with the copper layers of the symmetric bimetallic laminate 420 disposed in contact with the oxide layers on the copper foils 432 and 432'. The entire composite structure is then passed through a direct bonding temperature profile for the copper-copper oxide eutectic which forms the eutectic layers 428 and 428' which bond the symmetric bimetallic laminate to the foils 432 and 432'. Once the eutectic liquid solidifies, a single unitary structure results in which each of the components has substantially the same thermal coefficient of expansion. To this end, where a particularly exact match of the thermal coefficients of expansion is desired, the combined thickness of the foil 432 and the upper copper layer 422 of the bimetallic laminate 420 should be considered the thickness of the copper foil which comprises the upper layer of the symmetric bimetallic laminate. In a similar manner, the lower foil 426 of the laminate 420 and the foil 432' on the lower substrate 430' should be viewed as the lower foil on the bimetallic laminate. The core layer 424 of the bimetallic laminate is then selected with a thickness which results in a symmetric bimetallic laminate whose thermal coefficient of expansion is substantially identical to those of the two substrates 430 and 430'.

Figure 12:
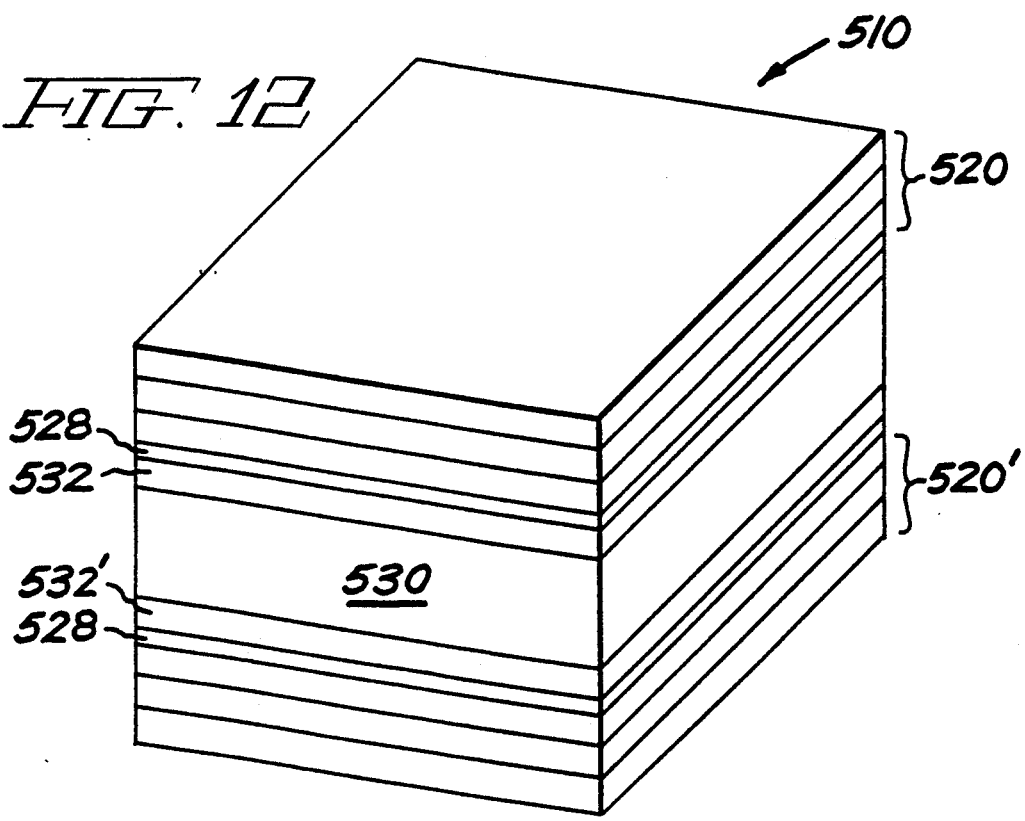
FIG. 12 illustrates another ceramic/symmetric bimetallic laminate structure in accordance with the present invention which is itself symmetric.

A still further composite structure in accordance with the present invention is illustrated generally at 510 in FIG. 12. In this composite, a central substrate 530 of ceramic material has symmetric bimetallic laminates 520 and 520' bonded to its upper and lower surfaces, respectively, to form a single unitary composite. This structure may preferably be formed by direct bonding two copper foil layers 532 and 532' to the opposed major surfaces of the substrate 530. Thereafter, the exposed surfaces of the layers 532 and 532' are oxidized and the symmetric bimetallic laminates are bonded to the foils 532 and 532' by passing the structure through a direct bonding temperature profile for the copper-copper oxide eutectic which forms the bonds 528 and 528'.

It will be understood, that although a copper outer layer for the symmetric bimetallic laminate and a molybdenum (or tungsten) inner layer for the laminate is preferred, other symmetrical bimetallic laminates may be employed. In particular, in accordance with the teachings of the above-identified incorporated by reference patents, external layers of copper, nickel, cobalt or iron can all be used. However, where a non-magnetic structure is desired, magnetic materials would not be used.

If desired, in the process of forming the composite structures which have been illustrated and described, where a ceramic structure is used, the step of first bonding a copper foil to that substrate prior to bonding that foil to the symmetric bimetallic laminate may be omitted. In that situation, the symmetric bimetallic laminate is direct bonded to the ceramic substrate. However, that procedure is not preferred at this time, since the lack of plasticity of the symmetric bimetallic laminate as a whole results in the formation of a lower quality bond between the ceramic and the symmetric bimetallic laminate than is formed in accordance with the preferred process.

In those structures in which a symmetric bimetallic laminate is bonded to a ceramic, the copper oxide layer which provides the oxygen needed for eutectic formation may be on the laminate, on a foil bonded to the ceramic, or both. Alternatively, that oxide layer may be omitted and the direct bonding process carried out in an ambient atmosphere which provides sufficient oxygen for the formation of the eutectic bonds without providing excess oxygen to the point that the eutectic mixture is converted to copper oxide.

While each of the figures illustrates the symmetric bimetallic laminate as being wide and flat, it will be understood that the bimetallic laminate may have any desired shape and may be formed in any desired manner. The important aspect of the bimetallic laminate is that it be free of thermal coefficient of expansion mismatch-induced bending and have a desired thermal coefficient of expansion. Consequently, this invention is applicable to multilayer laminates having structures of the type CBABC as well as BAB where the letters A, B and C represent different metals, although A and C could be the same metal. The CBABC structure is encompassed by the term "symmetric bimetallic laminate" because the inner structure BAB acts as a single layer. A wire or rod having a core of one material such as molybdenum and a sheath of another material such as copper is a symmetric bimetallic laminate because its symmetric structure results in symmetric stresses on the core with the result that no thermal coefficient of expansion mismatch-induced bending occurs. Such cylindrical symmetric bimetallic laminates are of particular interest as feedthroughs through ceramic insulators since their thermal coefficient of expansion can be matched to the ceramic to minimize stresses on the bond between them and the ceramic, thereby increasing reliability.

While the invention has been described in detail herein in accord with certain preferred embodiments thereof, many modifications and changes therein may be affected by those skilled in the art. Accordingly, it is intended by the appended claims to cover all such modifications and changes as fall within the true spirit and scope of the invention.

What is claimed is:

1. In combination:
   an electrically insulating substrate; and
   a symmetric bimetallic laminate, said symmetric bimetallic laminate comprising a core and outer layers said core comprising one or more of molybdenum and tungsten, and said outer layers comprising copper;
   said laminate bonded to said substrate by a metal-metal oxide eutectic material, said metal-metal oxide eutectic material including a metal of said outer layer of said laminate.

2. The combination recited in claim 1 wherein said structure further comprises:
   a metallic layer disposed between said symmetric bimetallic laminate and said electrically insulating substrate, said additional layer being eutectic bonded to both said substrate and said symmetric bimetallic laminate.

3. The combination recited in claim 2 wherein:
   said substrate comprises one or more of alumina and beryllia.

4. The combination recited in claim 1 wherein:
   said substrate comprises one or more of alumina and beryllia.

5. The combination recited in claim 1 wherein:
said core is molybdenum; and
said outer layers are copper.

6. A composite comprising:
a metallic substrate; and
a symmetric bimetallic laminate direct bonded to said substrate by a metal-metal oxide eutectic material, said metal-metal oxide eutectic material including a metal of an outer layer of said laminate, said symmetric bimetallic laminate comprising a core and outer layers, said core comprising one or more of molybdenum and tungsten, and said outer layers comprising copper.

7. The composite recited in claim 6 wherein:
said core is molybdenum; and
said outer layers are copper.

8. A composite structure comprising:
a ceramic substrate; and
a symmetric bimetallic laminate direct bonded to said substrate by a metal-metal oxide eutectic material, said metal-metal oxide eutectic material including a metal of an outer layer of said laminate, said symmetric bimetallic laminate comprising a core and outer layers, said core comprising one or more of molybdenum and tungsten, and said outer layers comprising copper.

9. The composite recited in claim 8 wherein:
the composition and relative thickness of the layers of said symmetric bimetallic composite provide said bimetallic laminate with substantially the same thermal coefficient of expansion as said ceramic substrate.

10. The composite recited in claim 8 wherein:
said core is molybdenum; and
said outer layers are copper.

11. A hermetic electronic package comprising:
a ceramic substrate;
a plurality of symmetric bimetallic strips direct bonded to said ceramic substrate by a metal-metal oxide eutectic material, said metal-metal oxide eutectic material including a metal of an outer layer of said symmetric bimetallic strips, each of said symmetric bimetallic strips comprising a core and outer layers, said core comprising one or more of molybdenum and tungsten, and said outer layers comprising copper; and
an electrically insulating sealing ring bonded to said ceramic substrate and said symmetric bimetallic strips and to a lip for forming a hermetically sealed cavity.

12. The package recited in claim 11 wherein:
each of said members has substantially the same thermal coefficient of expansion.

13. The package recited in claim 11 wherein:
said symmetric bimetallic laminate strips extend from within said hermetic enclosure to outside said hermetic enclosure to provide electrical feedthroughs between the interior and exterior of said hermetically sealed cavity.

14. The hermetic electronic package recited in claim 13 wherein:
said core is molybdenum; and
said outer layers are copper.

15. A composite structure comprising:
first and second ceramic substrates having similar dimensions and compositions; and
a symmetric bimetallic laminate having first and second major surfaces, said symmetric bimetallic laminate comprising a core and outer layers, said core comprising one or more of molybdenum and tungsten, and said outer layers comprising copper;
said first ceramic substrate being direct bonded to said first major surface of said symmetric bimetallic laminate by a metal-metal oxide eutectic material, said metal-metal oxide eutectic material including a metal of said outer layer of said laminate;
said second ceramic substrate being direct bonded to said second major surface of said symmetric bimetallic laminate by a metal-metal oxide eutectic material, said metal-metal oxide eutectic material including a metal of said outer layer of said laminate.

16. The composite structure recited in claim 15 wherein:
said core is molybdenum; and
said outer layers are copper.

17. A composite comprising:
a ceramic substrate having first and second major opposed surfaces; and
first and second symmetric bimetallic laminate layers of similar composition and configuration, said first and second symmetric bimetallic laminate layers each comprising a core and outer layers, said core comprising one or more of molybdenum and tungsten, and said outer layers comprising copper;
said first bimetallic laminate layer being direct bonded to said first major surface of said ceramic substrate by a metal-metal oxide eutectic material, said metal-metal oxide eutectic material including a metal of said outer layer of said first bimetallic laminate;
said second bimetallic laminate layer being direct bonded to said second major surface of said ceramic substrate by a metal-metal oxide eutectic material, said metal-metal oxide eutectic material including a metal of said outer layer of said second bimetallic laminate.

18. The composite recited in claim 17 wherein:
said core is molybdenum; and
said outer layers are copper.

19. A method of forming a substrate/symmetric bimetallic laminate composite comprising:
providing a symmetric bimetallic laminate having an outer layer whose composition is suitable for forming a liquid eutectic material at elevated temperatures, said eutectic material comprising a metal-metal oxide eutectic material including a metal of said outer layer of said laminate, said symmetric bimetallic laminate comprising a core and outer layers, said core comprising one or more of molybdenum and tungsten and said outer layers comprising copper;
providing a substrate to which said metal-metal oxide eutectic material can bond;
placing said symmetric bimetallic laminate and said substrate in close proximity;
heating said composite to the temperature of formation of said metal-metal oxide eutectic to form said metal-metal oxide eutectic as a liquid to cause said metal-metal oxide eutectic to wet both said bimetallic laminate and said substrate;
and cooling said composite to below the liquid/solid transition temperature of said metal-metal oxide eutectic to bond said bimetallic laminate and said substrate together as a unitary body.

20. The method recited in claim 19 wherein:

said bimetallic laminate has a molybdenum core and copper outer layers.

21. The method recited in claim 20 wherein:

said copper outer layer is exposed at at least one major surface of said bimetallic laminate.

22. The method recited in claim 19 further comprising the step of:

forming an oxide layer on an exposed surface of said bimetallic laminate or said substrate prior to completion of said heating step.

23. The method recited in claim 19 wherein:

said bimetallic laminate has a tungsten core and copper outer layers.

24. A composite structure comprising:

first and second symmetric bimetallic laminate layers, said first and second symmetric bimetallic laminate laminate layers each comprising a core and outer layers, said core comprising one or more of molybdenum and tungsten, and said outer layers comprising copper;

said first symmetric bimetallic laminate layer being direct bonded to said second symmetric bimetallic laminate layer by a metal-metal oxide eutectic material, said metal-metal oxide eutectic material including a metal of said outer layer of said first and said second symmetric bimetallic laminates.

25. The composite recited in claim 24 wherein:

said core is molybdenum; and said outer layers are copper.

* * * * *